United States Patent
Kim et al.

(10) Patent No.: US 9,191,013 B1
(45) Date of Patent: Nov. 17, 2015

(54) VOLTAGE COMPENSATION

(71) Applicant: Seagate Technology LLC, Cupertino, CA (US)

(72) Inventors: Byung Wook Kim, Suwon-si (KR); Jeffrey Kwak, Yongin-si (KR); In Su Lee, Anyang-si (KR); Jae Myung Pi, Yongin-si (KR)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/062,087

(22) Filed: Oct. 24, 2013

(51) Int. Cl.
 H03L 5/00 (2006.01)
 H03L 5/02 (2006.01)
(52) U.S. Cl.
 CPC .......................................... *H03L 5/02* (2013.01)
(58) Field of Classification Search
 USPC ........................................................ 327/306
 See application file for complete search history.

(56) References Cited

U.S. PATENT DOCUMENTS

| | | | |
|---|---|---|---|
| 4,268,785 A | 5/1981 | Svendsen | |
| 5,237,376 A | 8/1993 | Giardina | |
| 5,818,291 A | 10/1998 | Tiede | |
| 6,549,353 B1 | 4/2003 | Teterud | |
| 6,617,834 B2 | 9/2003 | Tran | |
| 7,518,351 B2 | 4/2009 | Liao | |
| 7,888,924 B2 | 2/2011 | Tran | |
| 7,948,720 B2 * | 5/2011 | Mok et al. | 361/18 |
| 8,159,202 B2 | 4/2012 | Boling | |
| 8,232,788 B2 | 7/2012 | Boling | |
| 8,283,906 B2 | 10/2012 | Shito | |
| 8,330,442 B2 | 12/2012 | Han | |
| 2013/0176007 A1 | 7/2013 | Devegowda | |

* cited by examiner

*Primary Examiner* — Daniel Puentes
(74) *Attorney, Agent, or Firm* — Cesari & Reed LLP; Kirk A. Cesari

(57) ABSTRACT

A circuit may be configured to reduce voltage dip or overshoot that can occur on power supply lines when current loads are turned on or off more quickly than a power supply can respond. The circuit can be configured to generate a compensation voltage that can be coupled into the supply lines when the current load changes.

20 Claims, 8 Drawing Sheets

US 9,191,013 B1

VOLTAGE COMPENSATION

SUMMARY

In certain embodiments, an apparatus may comprise a controller including an output and configured to generate a power control signal configured to control generation of a power compensation signal. Further, the controller can provide the power control signal to the output to control the timing of the power compensation signal to offset a transient load response of a power supply.

In certain embodiments, an apparatus may comprise a controller configured to generate a power control signal configured to control generation of a power compensation signal. Further, the apparatus may comprise a power compensation signal generator circuit configured to offset a transient load response of a power supply in response to the power control signal.

In certain embodiments, a method may comprise determining when a transient current is about to occur at a supply node and providing, via a compensation circuit, a power compensation signal to the supply node based on a power control signal.

DETAILED DESCRIPTION

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In electronic systems, power can be supplied to loads such as electronic circuits via voltage sources; some examples of voltage sources are low-dropout regulators, direct current (dc)-to-dc converters, and so forth. In conditions where the current demands of the load are within the recommended operating range of the voltage source (e.g. a power supply, power source, power supply, etc.), the output voltage of the source can remain at a set level. When the load current changes, the output of the voltage source, $V_{OUT}$, can dip or overshoot. The amplitude and duration of the voltage dips and overshoots can depend on the rate of change of the load current, $I_{LOAD}$, with respect to time, t, and can be represented by ($dI_{LOAD}/dt$). The momentary change in $V_{OUT}$ may also depend on the transient load response of the source; a faster transient load response can reduce the voltage dips and overshoots.

From time to time, the load current may change more rapidly than the transient load response of the source can accommodate. When the rate of change in the current load is positive, such as when the current changes from a low to high value (e.g. one amp to two amps), a dip may appear on the output of the voltage source. A voltage overshoot can occur when the load current changes from a high value to low value. Overshoots and dips may be undesirable in electronic systems. For example, when the output voltage of a source dips below a minimum threshold, the load may latch up, enter into an unstable state, or power off. Conversely, the load can be damaged or destroyed when the overshoot exceed a maximum threshold.

Voltage compensation systems, which may be comprised of discrete components, integrated circuits, processors, system on chips (SOCs), or any combination thereof, can reduce the voltage dips and overshoots by generating a voltage with a second voltage source substantially equal to $V_{OUT}$ at the time $I_{LOAD}$ changes, provided the second voltage source has sufficient current handling capability to overcome the transient load response limitations of the first voltage supply.

Figure 1:
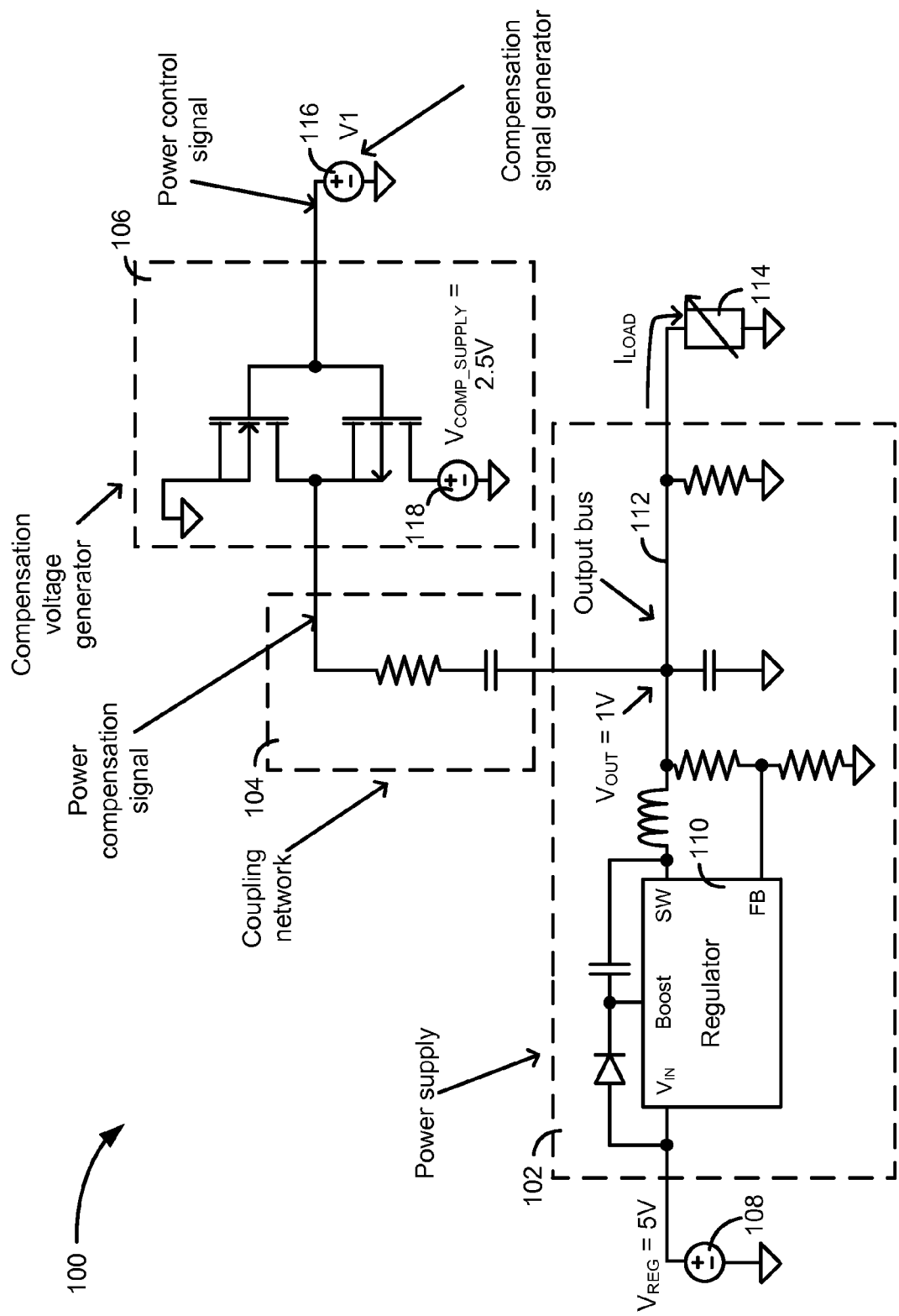
FIG. 1 is a diagram of a voltage compensation circuit, in accordance with certain embodiments of the present disclosure.

FIG. 1 is a diagram of a voltage compensation circuit, generally designated 100. The voltage compensation circuit 100 can include a power supply 102, a coupling network 104, a compensation voltage generator, which can be referred to as a power compensation signal generator, 106, and a compensation signal generator 116. The power supply 102 may include a voltage source 110 configured to generate an output voltage ($V_{OUT}$), a voltage supply ($V_{REG}$) 108, an output bus 112, and a load 114.

In the voltage compensation circuit 100, the coupling network 104 can be a resistor-capacitor (RC) network. In other embodiments, the coupling network 104 can be structured differently and may include passive components (e.g. resistors, inductors, capacitors, etc.) and active components (e.g. operational amplifiers, transistors, processors, etc.) that may be configured and controlled by external circuits, such as a processor or an MPU. And in other examples, the coupling network 104 may not be used.

The compensation voltage generator 106 can generate a compensation voltage (power compensation signal), based on a compensation power supply ($V_{COMP\_SUPPLY}$) 118 and a voltage compensation signal generated by the compensation signal generator 116, which may be referred to as a power control signal. In some embodiments, the generator 106 may be an amplifier that can take a low voltage, low current output of the compensation signal generator 116 and convert it into a voltage signal with sufficient current capacity (e.g. sourcing, sinking, etc.) to drive the load 114 while minimizing dips and overshoots. When the compensation signal is direct current (dc) (e.g. constant rather than pulsed or sinusoidal), the compensation voltage can be a dc value equal to a magnitude of the compensation voltage generator supply ($V_{COMP\_SUPPLY}$) 118. For example, in the voltage compensation circuit 100, the compensation generator 106 can be represented by a push-pull driver and may be powered by the compensation voltage source 118; although in various embodiments, the compensation generator 106 can be an operational amplifier, class-A amplifier, class-B amplifier, or other type of amplifier. In some embodiments, when the compensation signal is dc, the compensation voltage can be a magnitude of compensation voltage generator supply ($V_{COMP\_SUPPLY}$) 118 or can be a low voltage, depending on compensation signal value and the type of the compensation generator. In some embodiments, when the compensation signal is low, the compensation voltage can be 2.5 volts and when the compensation signal is high, the compensation voltage can be 0 volts. It should be noted, however, that the coupling network 104 may not be appropriate for a dc compensation voltage because the series capacitor can block the signal. When the compensation signal is alternating current (ac) (e.g. pulsed, sinusoidal, saw tooth, etc.), the magnitude of the compensation voltage can be a function of its amplitude, duty cycle, shape, and other factors. The resistor and capacitor values of the coupling network 104 can determine the frequency and time domain properties of the compensation voltage coupled onto the output bus 112.

The voltage source 110, which can be a dc-to-dc converter, boost converter, buck converter, low-dropout regulator (LDO), charge pump, or other type of voltage supply can generate output voltage, $V_{OUT}$, on an output bus 112. In some embodiments, the regulator 110 may be a step-down switching regulator configured to generate voltage, such as one volt, on the output bus 112. The voltage source 110 can be powered by a supply voltage, $V_{REG}$ 108. In some embodiments, the values of $V_{OUT}$ and $V_{REG}$ may have values other than the one volt and five volts, respectively, that are shown in FIG. 1. For example, $V_{OUT}$ may be four volts, and $V_{REG}$ may be six volts. In other embodiments, such as with boost converter circuits, $V_{OUT}$ may have a higher value than $V_{REG}$. The output bus 112 can supply the output voltage, $V_{OUT}$, and the load current, LOAD, to the load 114.

During operation, the load current, $I_{LOAD}$, may change due to different conditions in the load 114. For example, when the load 114 is a processor and its usage jumps from 25% to 80% (or 80% to 25%), the changes on $I_{LOAD}$ may result in dips or overshoots on the output bus 112. To reduce the effect $I_{LOAD}$ has on $V_{OUT}$, a voltage compensation signal can be generated by a compensation signal generator 116 (which can be a processor, a controller, software, etc.) when the load current changes, and sent to a compensation voltage generator 106 for amplification. The compensation voltage can be provided to the output bus 112 via the coupling network 104. In some examples, compensation signal generator 116 can generate a signal corresponding to the parameters of the load (e.g. a predicted current transition profile, period of time to provide the compensation voltage to the output bus 112, period of time to delay generating the compensation voltage, type of load, etc.). The compensation signal generator 116 may continually poll the load 114 for an indicator (e.g. bit settings in a register, high or low voltage on a pin, etc.) that a transient current event is about to occur, while in other examples, the load 114 may initiate communication with the generator 116, while in yet more examples, the generator 116 can detect electrical changes (e.g. load voltage or current, power supply output voltage levels, current or voltage sensing circuits, etc.) indicating that a transient current event is about to occur.

The circuit illustrated in 100 is but one example embodiment of a voltage compensation circuit. Other embodiments may use different circuit components and configurations.

The illustrative method of voltage compensation can be implemented in electronic systems such as data storage devices (DSD). Data storage devices have components, such as processors, preamps, transducer (which can include a reading element, a writing element, a reading element and a writing element), and motor drivers, whose current needs can exceed the transient load response of a voltage source. In some embodiments, the load can be a microprocessor unit (MPU) whose current requirements can change with a read/write state of the DSD.

An MPU can have a controller, a read/write channel, a host interface, controllers, read-only memory (ROM), volatile memory, a central processing unit (CPU), or any combination thereof. The MPU can be incorporated on one single integrated circuit (IC) which may be called a system on chip (SOC). Further, the MPU may initiate a read error recovery operation when a disc read operation fails. A read error recovery circuit, which can be located in the MPU, can activate and may increase a current demand at a rate faster than a transient load response of the MPU's voltage source can accommodate, which may result in a voltage dip. When the supply voltage dips below a threshold level, some of the components in the MPU, such as an R/W channel or a controller, may enter into an unstable state or power off altogether. When the read error recovery operation ends, the current consumption of the read error recover block may reduce rapidly, and can result in a voltage spike on the voltage supply. In some embodiments, the functions of a read error recovery block may be integrated into other components within the MPU or the SOC. Functions performed by components such as the controller and R/W channel may be performed in other components that may or may not be integrated into an SOC.

A voltage compensation circuit, which may be part of the MPU, can generate a compensation voltage that may be coupled into the voltage source signal at selected times, such as when an error recovery operation begins or ends. For example, the MPU can generate a voltage compensation control signal (e.g. sinusoidal, pulsed, etc.) that can be sent to the compensation voltage circuit for amplification.

Figure 2:
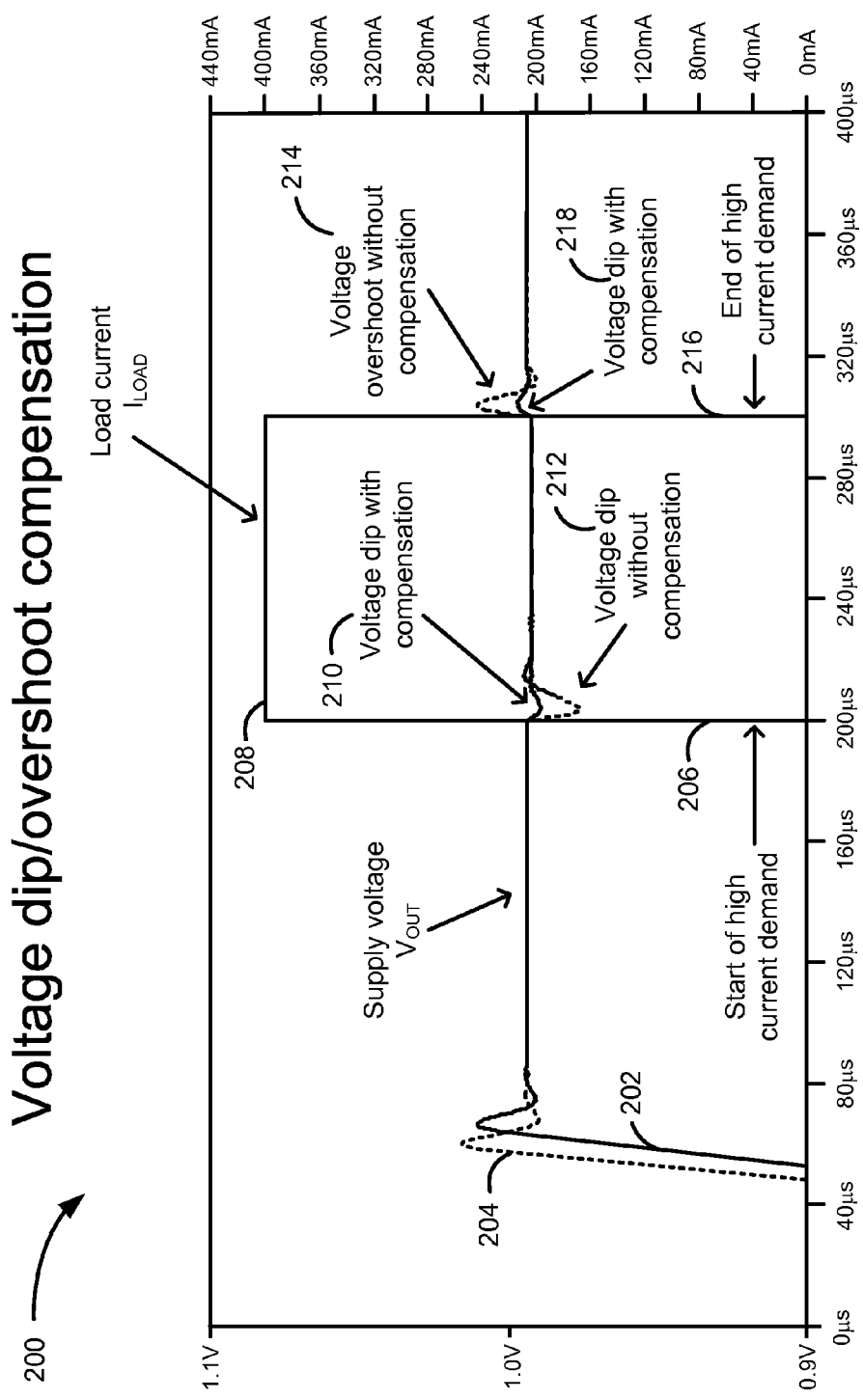
FIG. 2 is an illustrative method of voltage compensation, in accordance with certain embodiments of the present disclosure.

Referring to FIG. 2, an illustrative method of voltage compensation is shown and generally designated 200. Output signal 202 is a representation of the supply voltage, $V_{OUT}$, from the circuit 100 of FIG. 1 with voltage compensation enabled. Output signal 204, indicted with a hashed line, can represent $V_{OUT}$ with voltage compensation disabled (or removed).

When the current demand increases, at 206, the output signal 204 may have a voltage dip 212 many times larger than the output signal 202, at 210. When high current demands of the load end at 216, an overshoot of the output signal 204 may be larger than the output signal 202, at 218.

In method 200, the load current ($I_{LOAD}$) 208 can increase at time t=200 microseconds from a starting value of zero milliamps (in an application where $I_{LOAD}$ is an operating current of the MPU, the starting value would be greater than zero), at 206, to a peak value of 400 milliamps for 100 microseconds (e.g. until t=300 microseconds) before returning to the starting value at 216. In some embodiments, the starting value and the ending value may be different; the starting value may be higher than the ending value, and vice versa. Furthermore, neither the starting value, the peak value, or the ending value need to be positive. For example, a starting current could be −20 milliamps, a peak current could be −100 milliamps, and a final current could be 15 milliamps. In some embodiments, a change in load current may occur at different times. For example, the high current demand can begin 206 at t=80 microseconds and can end 216 at t=450 microseconds. In another example, the high current demand can start 206 at t=290 microseconds and may end 216 at t=305 microseconds.

In some embodiments, methods can be developed to implement voltage compensation in data storage devices (DSD), and in particular, for read error recovery events. When a controller issues a read command, a transducer can convert the magnetic flux over a disc into an electrical signal and send it to a preamplifier. The preamplifier can perform signal conditioning on the electrical signal (read signal) and send it to a read/write (R/W) channel for further processing. There may be times when there is an error with the read signal, which can result from bad sectors on the disc, a failed attempt to transfer data from the disc to the transducer, or from noise on the read signal.

When the microprocessor unit (which can include a controller, an error recovery block, an iterative error block, a host controller, a compensation control signal generator, and a read/write channel), or other processor or circuit, detects a read error, the error recovery block in the MPU can be activated. The compensation control signal generator can be configured to compensate for a voltage dip, and a compensation voltage can be generated and coupled into the supply of the MPU.

The read error may be recovered via several methods, including iterative decoding, which may be performed in an iterative decoding block of the MPU. After each iteration of a decoding operation, a controller (or iterative decoding block or other processor) can determine if the read error is recovered. When then the read error is not recovered, but no further iterations are performed, or when the read error has been recovered, the iterative error block in the MPU can be deactivated, which can cause a sharp drop in the current consumption of the MPU. The compensation control signal generator can be configured to compensate for a voltage overshoot and a compensation voltage can be generated and coupled to into the supply of the MPU. In some embodiments, more decoding operation iterations can be performed when the read error is not recovered.

Figure 3:
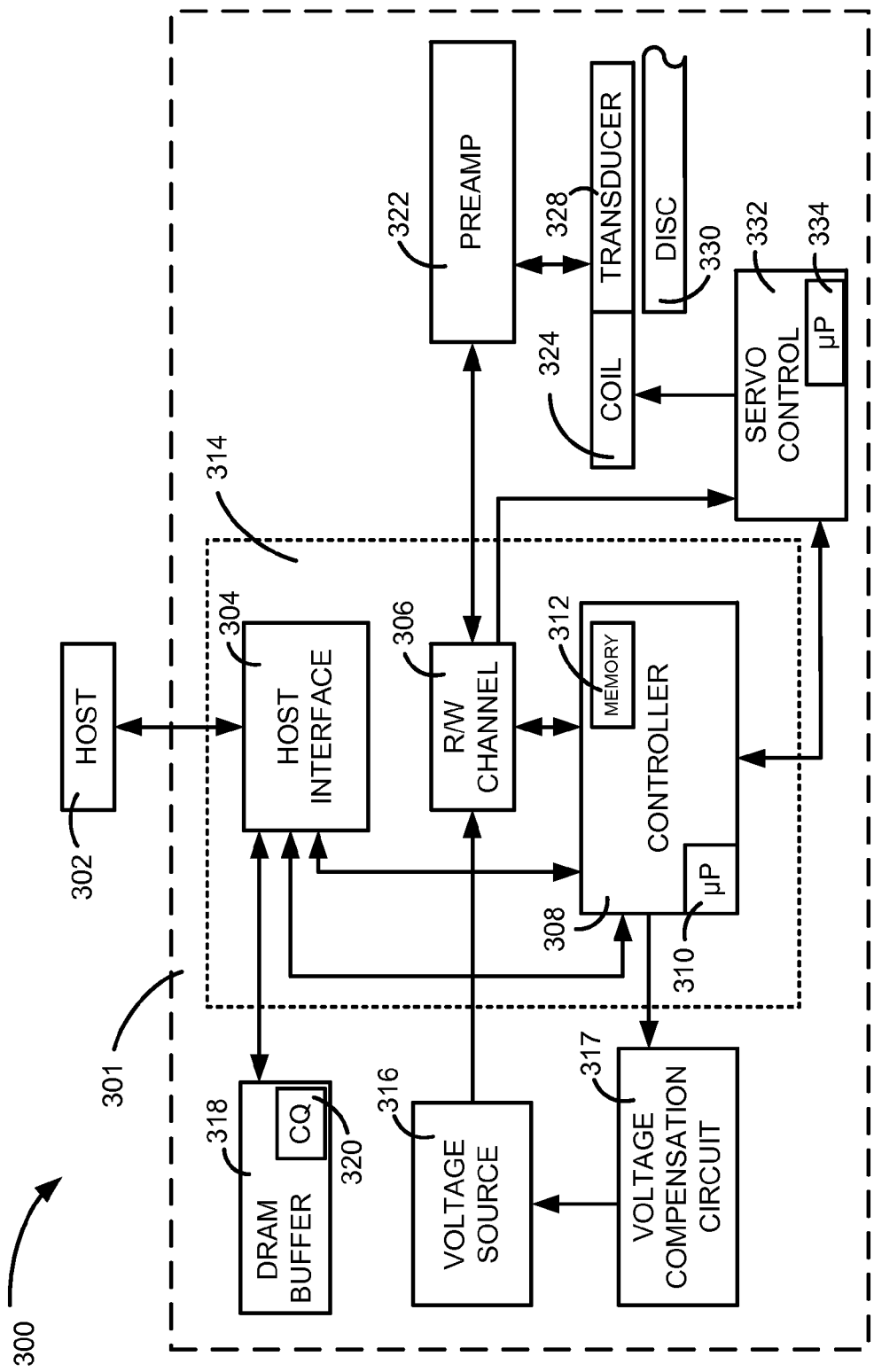
FIG. 3 is a diagram of a voltage compensation system, in accordance with certain embodiments of the present disclosure.

FIG. 3 depicts a system of voltage compensation, generally designated 300. Specifically, the system 300 provides a functional block diagram of a data storage device (DSD) and in particular, a hard disc drive with voltage compensation, and can be an example implementation of the circuit 100 and the methods 200 and 800. The DSD 301 can optionally connect to be removable from a host device 302, which can be a desktop computer, a laptop computer, a server, a telephone, a music player, another electronic device, or any combination thereof. The data storage device 301 can communicate with the host device 302 via the hardware/firmware based host interface circuit 304 that may include a connector that allows the DSD 301 to be physically removed from the host 302.

The DSD 301 can include a programmable controller 308 with associated memory 312 and processor 310. The programmable controller 308, the R/W channel 306, and the host interface 304 may be part of an MPU 314. A buffer 318 can temporarily store user data during read and write operations and can include a command queue (CQ) 320 where multiple access operations can be temporarily stored pending execution. The R/W channel 306 can encode data during write operations and reconstruct user data during read operations. A preamplifier/driver circuit (preamp) 322 can apply write currents to the transducer(s) 328 and can provide pre-amplification of readback signals. A servo control circuit 332 may use servo data to provide the appropriate current to the coil 324 to position the transducer(s) 328 over disc(s) 330. The controller 308 can communicate with a processor 334 to move the transducer(s) 328 to the desired locations on the disc(s) 330 during execution of various pending commands in the command queue 320 or during other operations.

Some components included in the MPU 314 may have two or more voltage sources when multiple voltage levels are required (e.g. 3.3 volts and 5 volts). The component(s) supplied by the voltage source 316 may have threshold limits. For example, components operating on a one volt supply bus may have a +/−50 millivolt operating tolerance; the components can operate properly with a supply as high as 1.05 volts and as low as 0.95 volts.

In the system 300, the host interface 304, read/write (R/W) channel 306, and controller 308 may all get power from voltage source 316, although they can get power from other sources (not shown). When read error recovery is activated, the controller 308 can generate a compensation correction signal. A voltage compensation circuit 317 (see 106) can amplify the signal and couple it on to the output bus of the voltage source 316 (refer to coupling network 104 and output bus 112).

Figure 4:
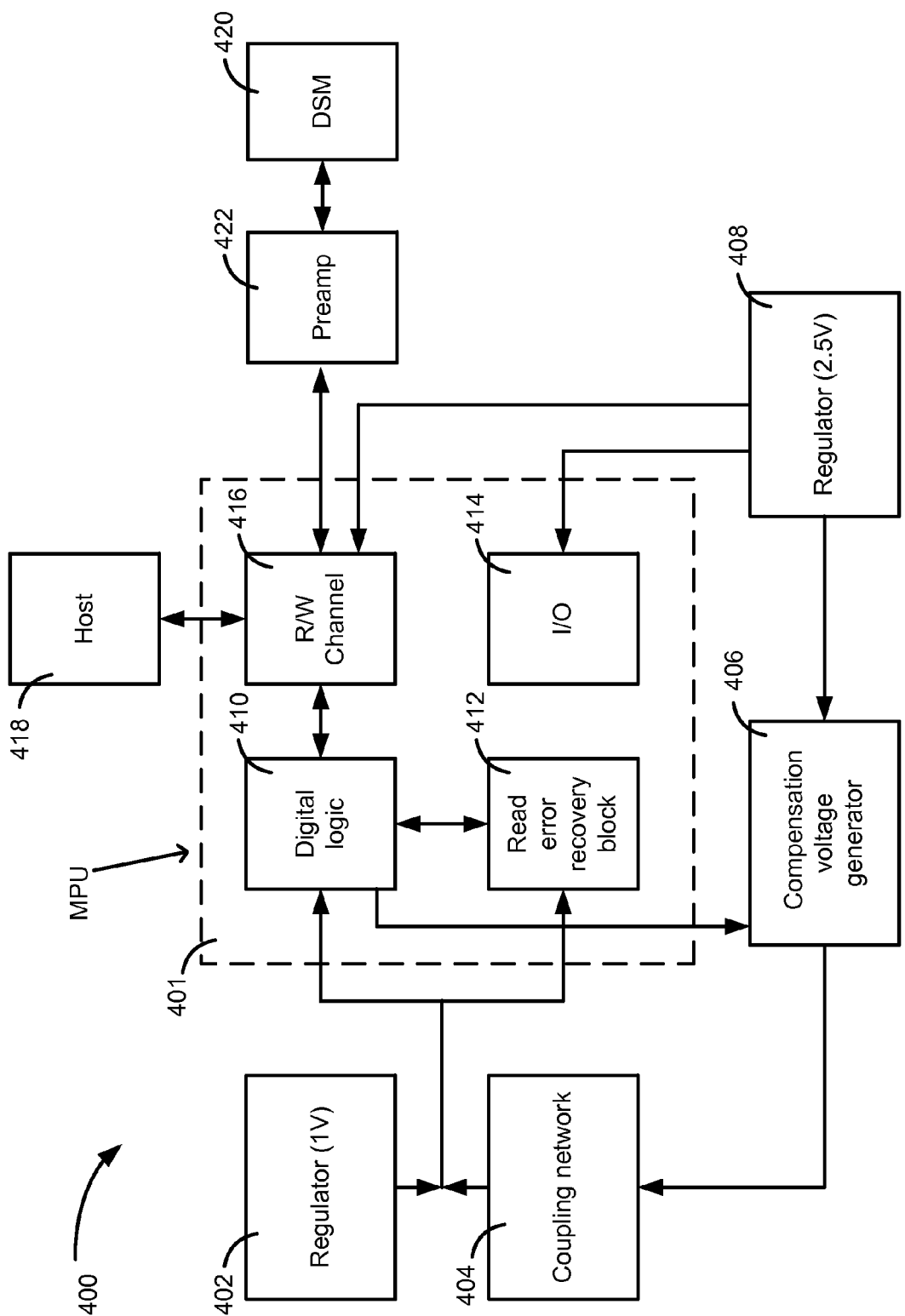
FIG. 4 is a diagram of a voltage compensation system, in accordance with certain embodiments of the present disclosure.

Referring to FIG. 4, a diagram of a voltage compensation system is shown and is generally designated 400. The system 400 can be an example implementation of the circuit 100 and the methods 200 and 800. The system 400 includes a micro processing unit (MPU) 401 with digital logic 410, read error recovery circuitry 412, input/output (I/O) circuitry 414, and a R/W channel 416.

A regulator (voltage source) 408, can provide power to a compensation voltage generator 406, the R/W channel 416 and the input/output (I/O) circuitry 414, although in some embodiments, the R/W channel 416 and I/O 414 circuit can receive power from other sources, such as the regulator 402, or a combination of two or more regulators. The regulator 402, which may be configured to output one volt, can provide power to the digital logic 410 and read error recovery circuitry 412 of the MPU 401.

The host 418 may send and receive data via a host interface (not shown) to the MPU 401. The data from the host may be written to, or read from, the data storage medium (DSM) 420, which may be a disc medium, via the preamp 422 and the R/W channel 416. If, during the course of reading DSM data, a read error occurs, the read error recovery circuit 412 may be activated and the MPU 401 may generate a voltage compensation signal. In this particular embodiment, the signal can be generated by the digital logic circuit 410 and sent to the voltage compensation generator 406. In some embodiments, the output of the voltage compensation generator 406 may be enabled during the read error recovery operation, and the compensation signal can determine the length of time the generator is enabled. For example, the output of the generator 406 can be a constant 2.5 volts during the read error recover operation, and may return to zero volts when the operation is over. In other embodiments, the generator 406 output may be pulsed, saw tooth, triangular, sinusoidal, or other shape. The output of the compensation generator 406 can be coupled onto the output of the regulator 402 via the coupling network 404, and the voltage variation can be kept within threshold limits.

A compensation voltage generator, which may amplify the voltage compensation signal, can be integrated into the microprocessor unit (MPU), integrated into the voltage regulator (voltage source), or may be a separate component in the system.

Figure 5:
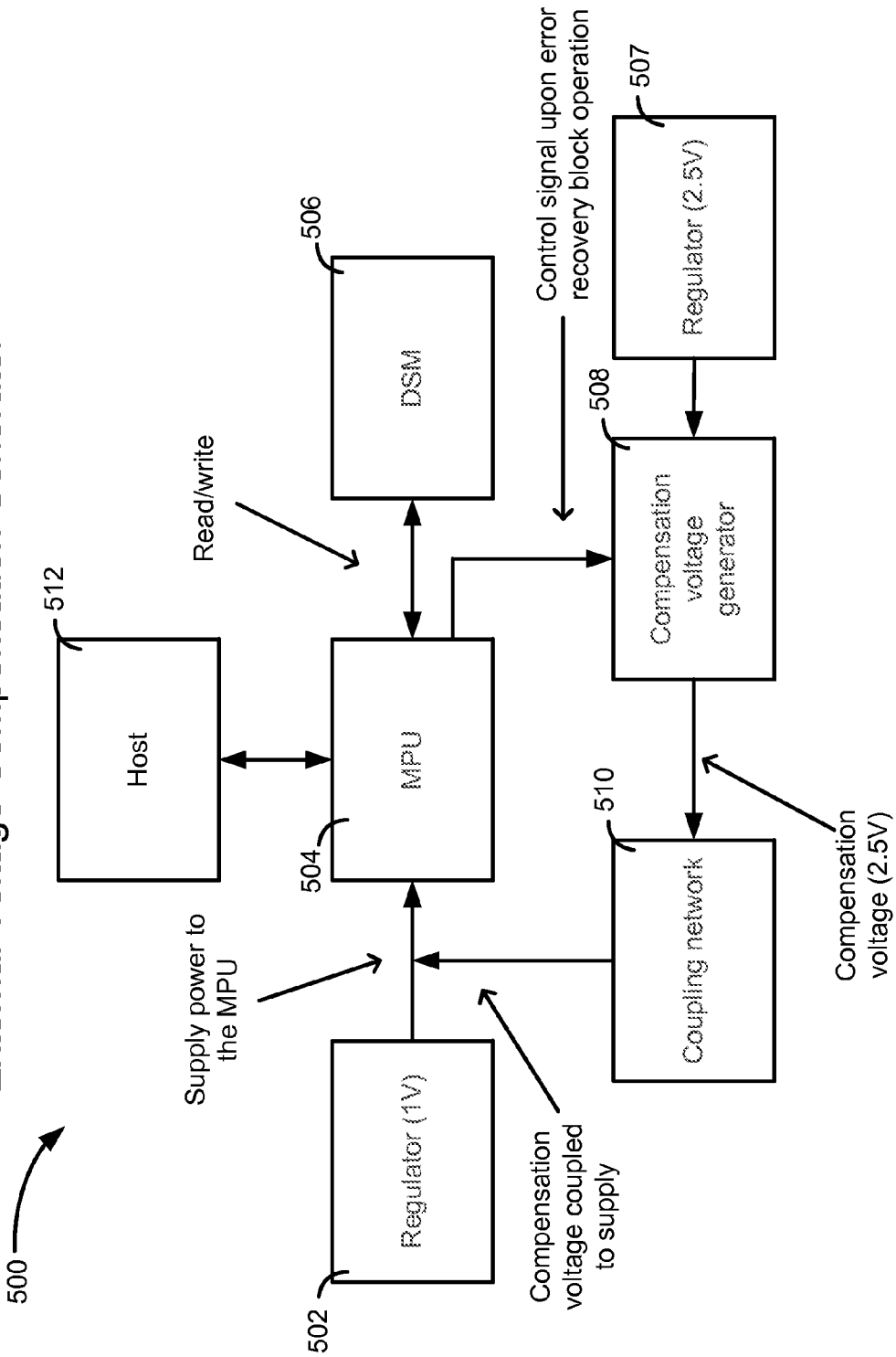
FIG. 5 is a diagram of a voltage compensation system, in accordance with certain embodiments of the present disclosure.

Referring to FIG. 5, a diagram of a voltage compensation system is shown and is generally designated 500. The system 500 can be an example implementation of the circuit 100 and the methods 200 and 800. In the system 500, the compensation voltage generator 508 can be separate from the MPU although it may be integrated into other systems in the DSD.

The system 500 can contain a voltage source 502 configured to supply a voltage (e.g. one volt) to an MPU 504. The MPU 504, which may contain a R/W channel, may read data from, and write data to, a DSM 506, via a preamp (not shown). The MPU 504 may also generate a voltage compensation signal and send it to a compensation voltage generator 508, which may be supplied by a voltage source 507.

A coupling network 510 can couple the compensation voltage to the output of the voltage source 502 and into the MPU 504. The host 512 can transmit and receive data and instructions to the MPU 504.

Figure 6:
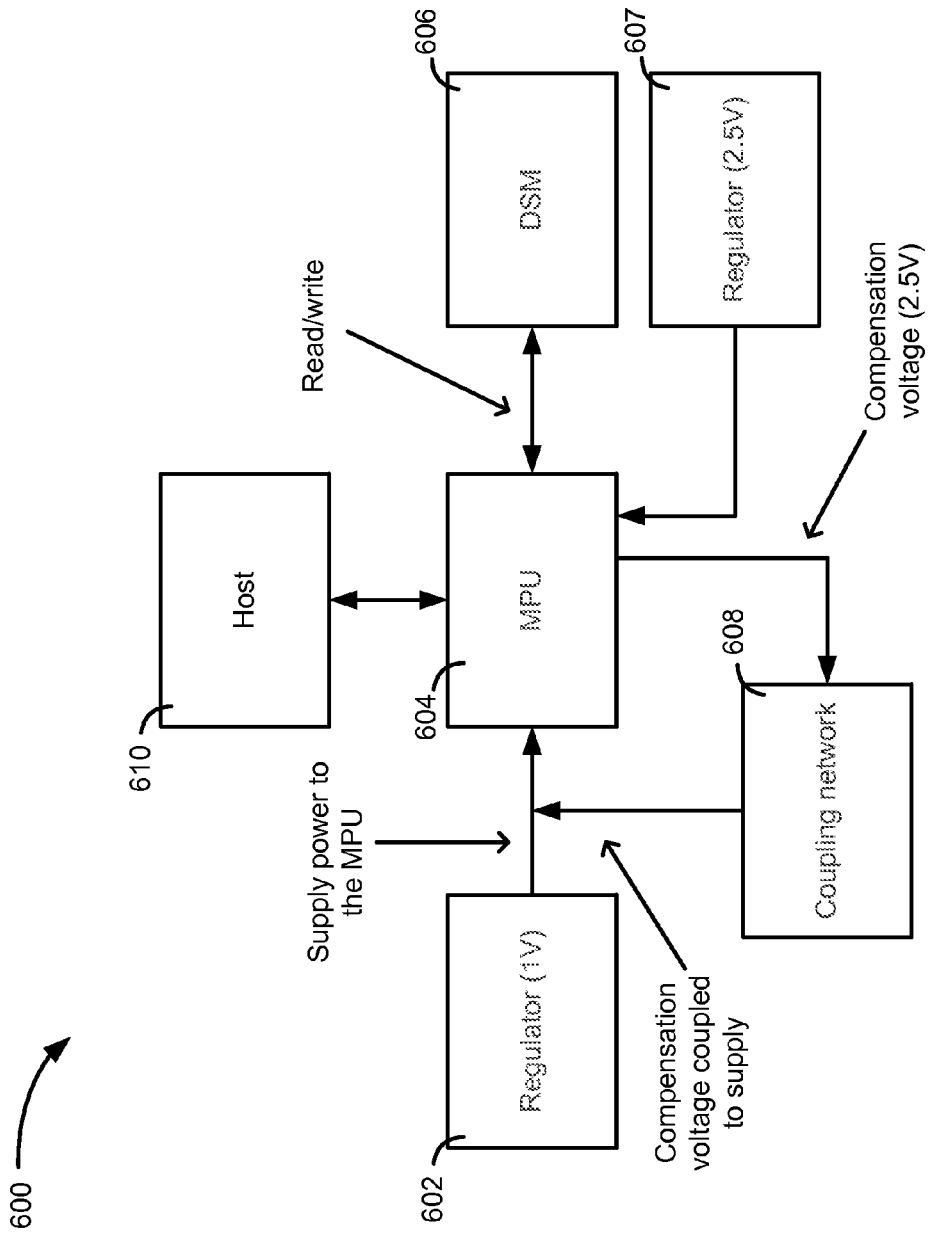
FIG. 6 is a diagram a voltage compensation system, in accordance with certain embodiments of the present disclosure.

Referring to FIG. 6, a diagram of a voltage compensation system is shown and is generally designated 600. The system 600 can be an example implementation of the circuit 100 and the methods 200 and 800. In system 600, the compensation voltage generator can be integrated into the MPU 604. The power supply for the generator can be external, a voltage source integrated into the MPU 604, or a combination of integrated and external voltage supplies.

The system 600 can contain a voltage regulator 602 configured to supply a voltage (e.g. one volt) to an MPU 604. In other embodiments, however, the regulator 602 can be configured to supply other voltage levels, such as 3.3 volts and 5 volts, and may be separate from other components or integrated into systems on the DSD. The MPU 604 can read data from, and store data to the DSM 606, and may have an integrated compensation voltage generator. The generator (not shown) may receive power from a voltage regulator 607 and can output a compensation voltage to the coupling network 608. In some embodiments, however, the generator may receive power from additional voltage sources. The network can couple the compensation voltage to the output of the voltage regulator 602 and into the MPU 604. The host 610 can transmit and receive data and instructions to the MPU 604.

The voltage regulator 607 may be set to a higher output voltage than the voltage regulator 602. For example, in the example embodiment of 600, the voltage regulator 602 can be configured to output one volt and the voltage regulator 607 can be configured to output 2.5 volts. In other embodiments, the voltage regulator 607 can be configured to output a plurality of voltage levels.

Figure 7:
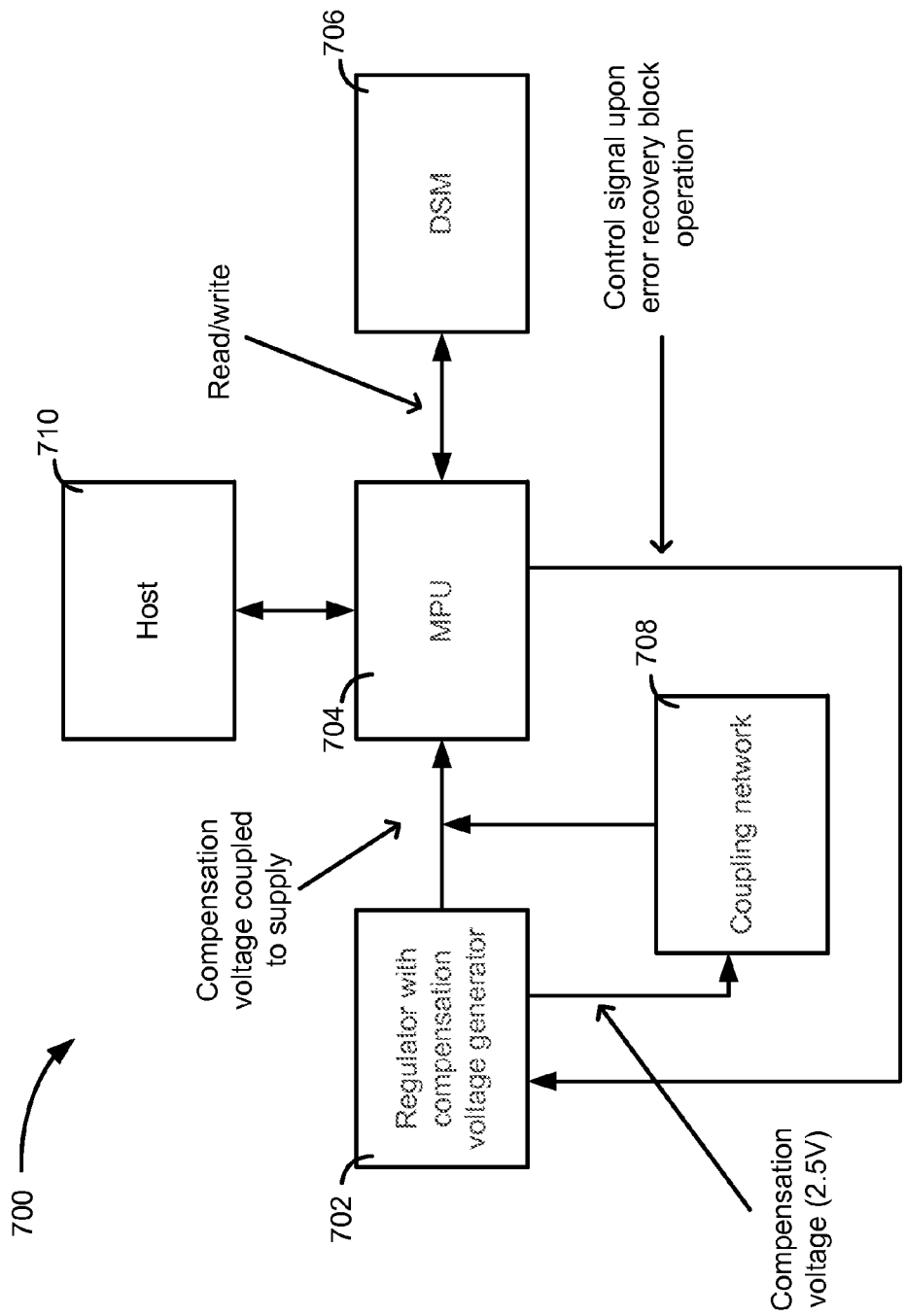
FIG. 7 is a diagram of a voltage compensation system, in accordance with certain embodiments of the present disclosure.

Referring to FIG. 7, a diagram of a voltage compensation system is shown and is generally designated 700. The system 700 can be an example implementation of the circuit 100 and the methods 200 and 800. In the voltage compensation system 700, the compensation voltage generator can be integrated into a voltage source 702. The host 710 may send and receive data via a host interface (not shown) to the microprocessor unit (MPU) 704. The voltage source 702 can generate a supply voltage (which, in some embodiments, may be one volt) for the MPU 704. The voltage source 702 can also have an integrated compensation voltage generator which can generate a compensation voltage whose amplitude and shape can be determined by the control signal of the MPU 704. The compensation voltage can be coupled into the MPU supply via the coupling network 708. The MPU 704 can send and receive data to and from the DSM 706.

Figure 8:
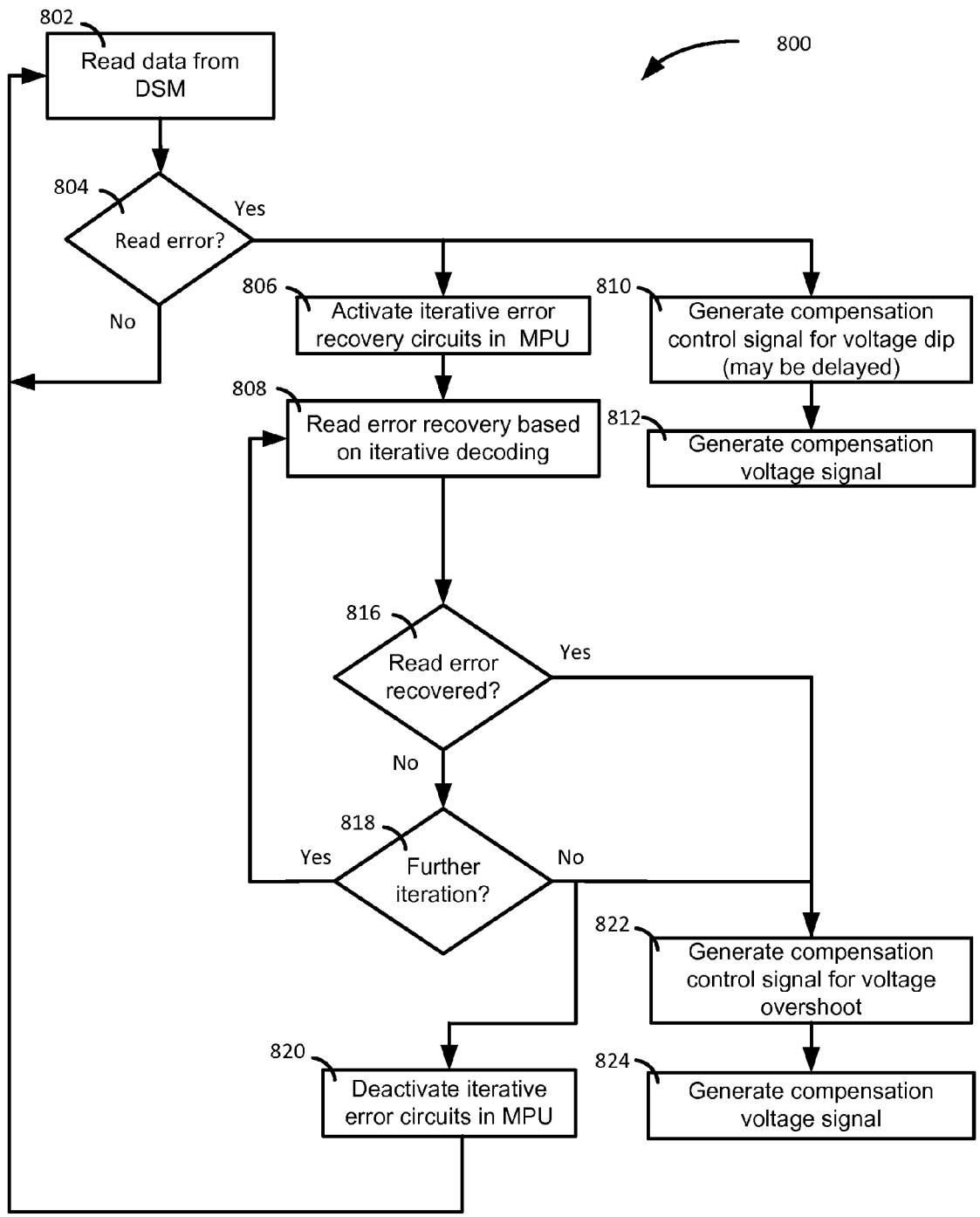
FIG. 8 is a flowchart of a method of voltage compensation, in accordance with certain embodiments of the present disclosure.

Referring to FIG. 8, a flowchart of a method of voltage compensation is shown and generally designated 800. The method 800 can be an example implementation of the circuit 100 and the system 300. The method 800 can read data from a DSM at 802, and can determine if a read error has occurred, at 804. A read error can occur as a result of bad sectors on a DSM, a failed attempt to transfer data from the DSM to a transducer, or from noise on the read signal. When no read error is detected, data may continue to be read from the DSM, at 802. When a read error is detected, at 804, error recovery circuits, which may be located in a microprocessing unit (MPU), can be activated at 806. A compensation control signal configured for voltage dips can be generated by a circuit (e.g. an MPU, voltage source, signal generator, etc.) at 810, at substantially the same time as the recovery circuits are activated at 806.

The method can start read error recovery, at 808, which can be performed in circuit (e.g. MPU, controller, R/W channel, etc.), and can rapidly draw substantially large amounts of current (load current) from a voltage supply; the change in load current can be faster than the transient load response of the voltage supply, and a dip can occur on a supply bus that could affect connected components, including an MPU. A circuit, such as an amplifier, can generate a compensation voltage at 812, which may be based on a compensation control signal and can be coupled to power supply circuits. In some embodiments, the compensation voltage can be pulsed, sinusoidal, a constant value, and so forth.

The method can determine when the read error is recovered at 816. When the read error is not recovered, at 816, the method can determine whether to perform more iterations in the error recovery process at 818. The decision to continue the process, at 818, can be made by an MPU, but may also be made by a controller, a CPU, a host, and so forth. When there are more iterations, the method can continue error recovery, at 808, and the compensation network output voltage may be remained at the same dc level.

When the read error is recovered at 816, or when a decision is made to discontinue the read error recovery process (which can be due to an expired timer, a reprioritization of resources, power down, etc.) at 818, error recovery circuits can be deactivated, at 820; deactivating error recovery circuits can result in a sharp decrease in current consumption, and may cause an overshoot to appear on power supply circuits. A circuit, such as an MPU, can generate a compensation control signal for voltage overshoot at 822. In embodiments where a load current transitions from a high value to a low value and back to a high value occurs (e.g. rapidly increasing a load resistance, turning a circuit with a normally high current draw off and then back on, etc.), the method 800 can change. For example, the method might generate compensation control signal for a voltage overshoot rather than a dip, at 810, and for a voltage dip rather than an overshoot, at 822. A circuit, such as an amplifier, can generate a compensation voltage at 824 which can be coupled to supply circuits. The method can read data from a DSM at 802.

The method 800 can be altered to apply to other transient current events in the DSD, such as the control of electric motors. The method can also be adapted to apply to other systems, such as audio amplifier circuits where large amplitude, low frequency transients can cause supply variations.

Systems 400 through 700, and the method 800, are examples of voltage compensation implemented in data storage devices, which can include disc storage, solid state storage, or other storage, or any combination thereof. Additionally, voltage compensation may be used in other applications such as motor controls, lighting, automotive, power generation, home theater, and so forth.

In accordance with various embodiments, the methods described herein may be implemented as one or more software programs running on a computer processor or controller. In accordance with another embodiment, the methods described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods described herein. Further, the methods described herein may be implemented as a computer readable storage medium or device including instructions that when executed cause a processor to perform the methods.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a controller including an output and configured to:
   generate a power control signal configured to control generation of a power compensation signal;
   provide the power control signal to the output to control timing of the power compensation signal to offset a transient load response of a first power supply at a node;
   receive an indication of a change in current prior to the change in current starting; and
   generate the power control signal based on the indication.

2. The apparatus of claim 1 further comprising:
   a power compensation signal generator to generate the power compensation signal in response to the power control signal and to couple the power compensation signal to the node.

3. The apparatus of claim 2 comprising the power compensation signal generator further configured to offset voltage variation in a voltage at the node such that the voltage variation is less than a pre-determined threshold.

4. The apparatus of claim 2 comprising the controller further configured to:
   generate the power control signal based on a predicted waveform corresponding to the change in current; and
   control the power compensation signal generator to maintain the power compensation signal for a period of time.

5. The apparatus of claim 2 comprising the controller further configured to:
   delay generating the power control signal for a period of time based on one or more parameters corresponding to a load.

6. The apparatus of claim 2 further comprising the first power supply configured to:
   receive an input voltage at a supply input and generate a supply voltage at a supply output coupled to the node; and
   provide the supply voltage to the node.

7. The apparatus of claim 6 further comprising a coupling network connected between the node and an output of the power compensation signal generator that provides the power compensation signal to the node.

8. The apparatus of claim 7 further comprising the coupling network includes a direct current (DC) blocking component.

9. The apparatus of claim 2 further comprising the power compensation signal generator includes an amplifier configured to overcome a transient load response limitation of the first power supply.

10. The apparatus of claim 8 further comprising the amplifier includes a push-pull amplifier configured to generate an alternating current (AC) waveform.

11. An apparatus comprising:
    a controller configured to generate, responsive to a one of a parameter of a load coupled to a node, an indicator from the load and a communication from the load, a power control signal that controls generation of a power compensation signal;
    a power compensation signal generator circuit configured to generate the power compensation signal, to offset a transient load response of a first power supply at the node, in response to the power control signal;
    the controller configured to:
    receive an indication that a digital data communications channel detected an error; and
    send the power control signal to the power compensation signal generator in response to the indication of the error.

12. The apparatus of claim 11 further comprising:
    a coupling network having at least one capacitor coupled between an output of the power compensation signal generator and the node.

13. The apparatus of claim 12 further comprising:
    the first power supply circuit coupled to the coupling network and a load; and
    the first power supply coupled to the node and receiving an input voltage from an external voltage source.

14. The apparatus of claim 12 further comprising:
    the apparatus is a data storage device (DSD) including:
    a data storage medium;
    a microprocessor unit (MPU); and
    the power compensation signal generator circuit.

15. The apparatus of claim 14 further comprising:
    the microprocessor unit configured to receive power from the first power supply; and
    the microprocessor unit configured to control storing data to the data storage medium and generate the power control signal.

16. The apparatus of claim 15 further comprising:
    the digital data communications channel configured to detect read errors of the data storage medium.

17. A method comprising:
    determining, via a control circuit, a transient current event is about to occur at a supply node, the determining occurring prior to the transient current event starting; and
    providing, via a compensation circuit, a power compensation signal to the supply node based on a power control signal from the control circuit.

18. The method of claim 17 further comprising:
generating the power control signal based on a predicted waveform corresponding to a predicted transient current event.

19. The method of claim 18 further comprising:
amplifying the power control signal, via a power compensation circuit, to produce a power compensation signal based on a transient load response limitation of a power supply.

20. The method of claim 17 further comprising:
receiving an indication from a digital data communications channel that a transient current event is predicted to occur, the indication received prior to the transient current event starting; and
initiating the power compensation signal generator in response to the indication.

* * * * *